(12) United States Patent
Carter et al.

(10) Patent No.: US 9,590,579 B2
(45) Date of Patent: Mar. 7, 2017

(54) WIDE RANGE TRANSIMPEDANCE AMPLIFIER

(71) Applicant: Analog Devices, Inc., Norwood, MA (US)

(72) Inventors: Nathan R. Carter, Arroyo Grande, CA (US); Yogesh Jayaraman Sharma, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/812,894

(22) Filed: Jul. 29, 2015

(65) Prior Publication Data

US 2016/0099694 A1     Apr. 7, 2016

Related U.S. Application Data

(60) Provisional application No. 62/060,963, filed on Oct. 7, 2014.

(51) Int. Cl.

| | |
|---|---|
| *H03F 3/08* | (2006.01) |
| *H03G 1/00* | (2006.01) |
| *H03F 1/30* | (2006.01) |
| *H05K 13/00* | (2006.01) |
| *H03F 3/45* | (2006.01) |

(52) U.S. Cl.
CPC .......... *H03G 1/0088* (2013.01); *H03F 1/303* (2013.01); *H03F 3/087* (2013.01); *H03F 3/45475* (2013.01); *H05K 13/0023* (2013.01); *H03F 2200/135* (2013.01); *H03F 2200/234* (2013.01); *H03F 2200/447* (2013.01); *H03F 2200/468* (2013.01); *H03F 2203/45138* (2013.01); *H03F 2203/45151* (2013.01); *H03F 2203/45526* (2013.01); *H03F 2203/45528* (2013.01); *H03F 2203/45534* (2013.01)

(58) Field of Classification Search
CPC ....................................................... H03F 3/08
USPC ....................................................... 330/9, 308
See application file for complete search history.

(56) References Cited

U.S. PATENT DOCUMENTS

| | | | |
|---|---|---|---|
| 4,924,190 | A | 5/1990 | Cooke |
| 5,191,297 | A | 3/1993 | Penman et al. |
| 5,486,791 | A | 1/1996 | Spitalny et al. |
| 6,710,317 | B2 | 3/2004 | Meadows |
| 7,327,189 | B2 | 2/2008 | Regier |
| 7,657,191 | B2 | 2/2010 | Killmeyer et al. |

(Continued)

OTHER PUBLICATIONS

Orozco, Programmable-Gain Transimpedance Amplifiers Maximize Dynamic Range in Spectroscopy Systems, Analog Dialogue 47(5), pp. 1-5, May 2013.

(Continued)

*Primary Examiner* — Henry Choe
(74) *Attorney, Agent, or Firm* — Knobbe, Martens, Olson & Bear, LLP (57) ABSTRACT

One aspect of this disclosure is a transimpedance amplifier circuit with multiple resistive feedback loops can be implemented with multiple Kelvin sensing channels. A transimpedance amplifier and multiple Kelvin sensing channels can be implemented on a single die having multiple contacts, such as pins, for connecting multiple resistors to the Kelvin sensing channels. The Kelvin sensing channels can be implemented with T-junction switch networks in certain embodiments.

21 Claims, 9 Drawing Sheets

(56) References Cited

U.S. PATENT DOCUMENTS

| | | | |
|---|---|---|---|
| 7,868,701 B2 | 1/2011 | Nakamura et al. | |
| 7,876,520 B1 | 1/2011 | Voo et al. | |
| 7,948,323 B2 | 5/2011 | Shivaram et al. | |
| 8,232,512 B2* | 7/2012 | Marzuki | H03F 3/08 250/205 |
| 9,006,638 B2* | 4/2015 | Sun | H03F 3/08 250/214 A |
| 2016/0099695 A1* | 4/2016 | Kiritani | H03F 3/08 330/251 |

OTHER PUBLICATIONS

Analog Devices, Data Sheet for ADA4896-2/ADA4897-1/ADA4897-2 Amplifiers, Analog Devices, Inc. Revision B, Apr. 2012. Available at: http://www.analog.com/media/en/technical-documentation/data-sheets/ADA4896-2_4897-1_4897-2.PDF (accessed: Oct. 9, 2015).

* cited by examiner

WIDE RANGE TRANSIMPEDANCE AMPLIFIER

CROSS-REFERENCE TO RELATED APPLICATION

This application claims the benefit under 35 U.S.C. §119(e) of U.S. Provisional Application No. 62/060,963, filed on Oct. 7, 2014, the entirety of which is hereby incorporated by reference.

BACKGROUND

Technical Field

The described technology generally relates to electronics, more specifically, to transimpedance amplifiers and associated switch networks.

Description of the Related Art

In high-impedance current producing sensor interfaces, a transimpedance amplifier (TIA) may be used to convert a relatively small current signal to a relatively large output voltage signal. For example, an input current signal, such as photodiode current signal, can have a wide dynamic range from less than about 1 nano-Ampere (nA) up to greater than about 10 milli-Ampere (mA), depending on the intensity of the incident light at the specific frequency of excitation. Using a fixed gain TIA, it may be desirable to have a high resolution ultra-low noise signal chain to process the signal further. A network of parallel resistor banks having respective switches or relays in series may be used to dynamically change the TIA gain to resolve the output signal in the correct signal range. Such a switch network, however, can suffer from various sources of error, as the switch resistance in series with the gain resistance can lead to a variation in the gain of the TIA over supply, temperature, and process variations. Furthermore, typical implementations using series relays can be bulky and/or can be difficult to integrate with the TIA.

SUMMARY

The methods and devices of the described technology each has several aspects, no single one of which is solely responsible for its desirable attributes. Without limiting the scope of the claims, some prominent features will now be briefly described.

In one embodiment, an apparatus includes a die, and the die includes a transimpedance amplifier, a switch network, and a contact configured to provide an electrical connection to the intermediate node external to the die. The switch network includes an input switch, an intermediate node, and an output switch, the input switch being electrically connected to the output switch at the intermediate node, wherein the input switch is electrically connected between an output of the transimpedance amplifier and the intermediate node.

In another embodiment, an apparatus includes a transimpedance amplifier, and Kelvin sensing switches electrically connected to an output of the transimpedance amplifier, wherein at least one of the Kelvin sensing switches comprises a T-junction switch network.

In another embodiment, a method of manufacturing an electronic device includes electrically connecting resistors between an input of a transimpedance amplifier and respective intermediate nodes between respective pairs of Kelvin sensing switches, wherein each of the pairs of Kelvin sensing switches comprises an input switch and an output switch arranged in series with the input switch, the input switch coupled between an output of the transimpedance amplifier and a respective intermediate node.

BRIEF DESCRIPTION OF THE DRAWINGS

These drawings and the associated description herein are provided to illustrate specific embodiments of the described technology and are not intended to be limiting.

DETAILED DESCRIPTION

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

One embodiment is an apparatus including a transimpedance amplifier and switches configured to implement a plurality of feedback loops. Each of the feedback loops includes an intermediate node between an input switch device of the switches and an output switch device of the switches. The input switch device can be electrically connected between an output of the transimpedance amplifier and the intermediate node. The output switch device can be configured to electrically connect the intermediate node to an output amplifier. The transimpedance amplifier and the switches can be on a single die.

Each of the input switch device and the output switch device can include a pull-up device connected to a first junction between a first switch and a second switch a pull-down device connected to a second junction between a third switch and a fourth switch. The pull-up device, the third switch, and the fourth switch can be configured to be on responsive to a first signal. The pull-down device, the first switch, and the second switch can be configured to be on responsive to a second signal. The first signal can be an inverse (or logical complement) of the second signal.

The switch network can be configured to have three or more feedback loops. The apparatus can also include the output amplifier. The transimpedance amplifier, the switch network, and the output amplifier can be on the single die.

The apparatus can include a resistor in each feedback loop having a different resistance value. Each resistor can be electrically coupled between a respective intermediate node and an inverting input of the transimpedance amplifier. The resistor in each feedback loop can be external to the single die. Having external resistors can allow the gain of transimpedance amplifier to be configurable for particular applications, while also being able to achieve advantages associated with having the transimpedance amplifier and the switches on a single die.

Another embodiment is an apparatus including a transimpedance amplifier and Kelvin sensing switches electrically connected to an output of the transimpedance amplifier. At least one of the Kelvin sensing switches is implemented by a T-junction switch network. The T-junction switch network can reduce or eliminate capacitive feed through when Kelvin sensing switches are off. This can prevent capacitive feed through from lowering the bandwidth of the transimpedance amplifier. When there are multiple sets of Kelvin sensing switches arranged between a transimpedance amplifier output and an input to an output amplifier, reducing capacitive feed through by using T-junction switch networks can be particularly advantageous.

In this description, reference is made to the drawings where like reference numerals can indicate identical or functionally similar elements. It will be understood that elements illustrated in the figures are not necessarily drawn to scale. Moreover, it will be understood that embodiments can include more elements than illustrated in a particular drawing and/or a subset of the illustrated elements in a particular drawing. The terms "transimpedance amplifier" or "TIA" as used herein generally refer to the amplifier of the transimpedance amplifier without the feedback elements.

Figure 1:
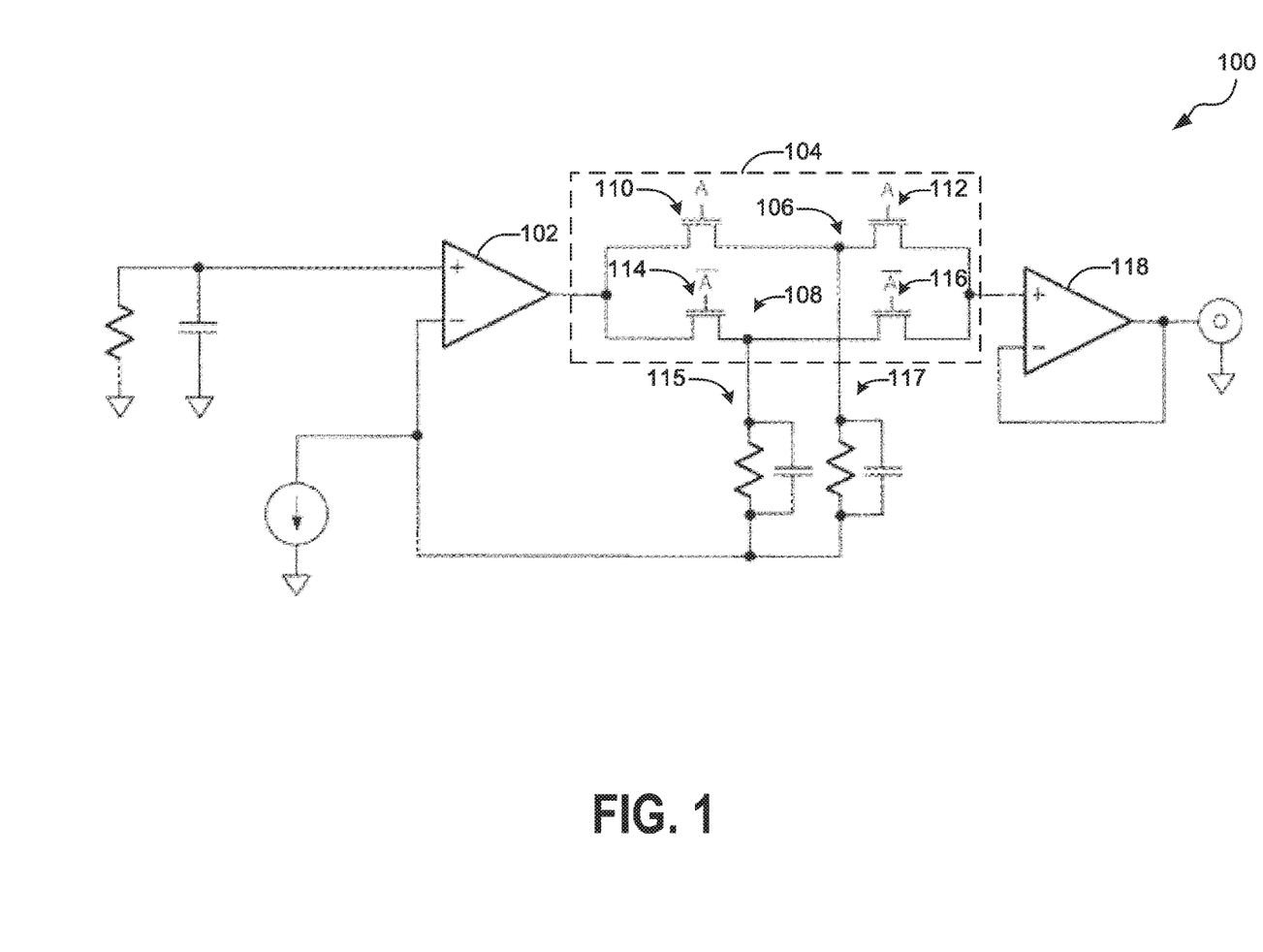
FIG. 1 is a schematic diagram illustrating a transimpedance amplifier with an example Kelvin sensing switch network, according to an embodiment.

FIG. 1 is a schematic diagram illustrating a transimpedance amplifier with an example Kelvin sensing switch network. The illustrated apparatus 100 includes a transimpedance amplifier 102, a Kelvin sensing switch network 104, and an output amplifier 118. The Kelvin sensing switch network 104 includes input switches 110, 114, output switches 114, 116, and intermediate or feedback nodes 106 and 108. The input switch 110 and the output switch 112 can be referred to as a first pair of Kelvin sensing switches and the input switch 114 and the output switch 116 can be referred to as a second pair of Kelvin sensing switches. The intermediate node 106 is in a first feedback path from the output of the transimpedance amplifier 102 to the inverting input of the transimpedance amplifier 102. As illustrated, the first feedback path includes the input switch 110, the first feedback node 106, and a first impedance element 117. The intermediate node 108 is in a second feedback path from the output of the transimpedance amplifier 102 to the inverting input of the transimpedance amplifier 102. As illustrated, the second feedback path includes the input switch 114, the second intermediate node 108, and a second impedance element 115. The output amplifier 118 may receive the output of the transimpedance amplifier 102 through the Kelvin sensing switch network 104 and produce an output of the illustrated apparatus 100.

The transimpedance amplifier 102 may receive a relatively small input current at its inverting input as illustrated in FIG. 1. As illustrated in FIG. 1, A and $\overline{A}$ denote that either a first channel, having the switches 110 and 112 and the intermediate node 106, or a second channel, having the switches 114 and 116 and the intermediate node 108, will be active as the apparatus 100 (and in turn the Kelvin sensing switch network 104) receives the signal A and/or $\overline{A}$. As illustrated, A and $\overline{A}$ are logical complement signals. According to the A and/or $\overline{A}$ signal the apparatus 100 receives or generates, either the switches 110 and 112 will be on or the switches 114 and 116 will be on completing either of their respective channels providing different gain values to the transimpedance amplifier 102. For example, the impedance value of the first impedance element 117 may correspond to the resistance of 1 kΩ and the capacitance of 0.1 pF while the impedance value of the second impedance element 115 may correspond to the resistance of 1 MΩ and the capacitance of 0.1 nF, providing different gain values to choose from depending on, for example, the desired output signal range. When three or more channels are included in the Kelvin sensing switch network 104, these channels can be activated with any suitable control signals such that one or more of the channels can be activated at a time.

The Kelvin sensing switch network 104 removes or corrects for the switch resistance that would be present in series with the typical parallel resistor bank-based variable gain transimpedance amplifier as the Kelvin sensing switch network 104 performs sensing independent of driving. In one embodiment, the switches 110, 112, 114, and 116, and the switches illustrated in FIG. 2 may be implemented with field effect transistors, such as metal oxide semiconductor (MOS) devices including NMOS devices and/or PMOS devices. While the terms "metal" and "oxide" may be present in, for example, a MOSFET, MOS transistors can have gates made out of materials other than metals, such as polysilicon, and have dielectric oxide regions made from dielectrics other than silicon oxide, such as a high-k dielectric. In another embodiment, the switches 110, 112, 114, and 116 and the switches illustrated in FIG. 2 may be implemented with other devices on silicon, compound, or any other suitable semiconductor. In another embodiment, the Kelvin sensing switch network 104 may include more switch elements to alleviate the capacitive feed through from the path that is turned off as a result of the limited capacitive isolation of a single off MOS device. Capacitive feed through in transimpedance amplifier applications may limit the bandwidth between different transimpedance settings. While low transimpedance values typically have a relatively large capacitance across the feedback resistor, the high transimpedance values can have a relatively small capacitance value. Any feed through from the low transimpedance setting while that path is off can limit the bandwidth of the high transimpedance setting while it is on. Further details of an example implementation of the Kelvin sensing switch network 104 with reduced capacitive feed through are illustrated in and described in connection with FIG. 2 below.

In certain embodiments, the transimpedance amplifier 102, and the Kelvin sensing switch network 104 may be implemented on one die. In some of these embodiments, the transimpedance amplifier 102, the Kelvin sensing switch network 104, and the output amplifier 118 may be implemented on one die. In an embodiment, a second Kelvin sensing switch network with its input, intermediate, and output nodes electrically connected to a plurality of contacts may be implemented on the same die. According to certain embodiments, the Kelvin sensing switch network 104 with three feedback loops may be implemented. For instance, the embodiments shown in FIGS. 3-4F include at least three feedback paths. As one example, an advantage of single-die implementations includes being able to include a greater number of switch elements to reduce errors that would otherwise be impractical on a printed circuit board (PCB) with multiple separate modules. For instance, the Kelvin sensing switch network in the embodiment shown in FIG. 2 may be impractical to implement on a PCB when the switches are included on a separate die than the transimpedance amplifier. As another example, an advantage of integrating the transimpedance amplifier 102 and the Kelvin sensing switch network 104 as one unit includes providing customizability for the user to implement a transimpedance amplifier circuit with different feedback elements, such as resistors and/or capacitors, according to the user's specific requirements. Further details regarding a customizable unit application of the principles and advantages discussed herein are illustrated in and described below in connection with FIGS. 3-4F. As yet another example, providing a Kelvin sensing switch network and a transimpedance amplifier on a single die can lead to a size reduction of the overall system, which can be particularly useful in contexts, such as mobile devices, in which there is a significant desire for miniaturization of electronic components.

Figure 2:
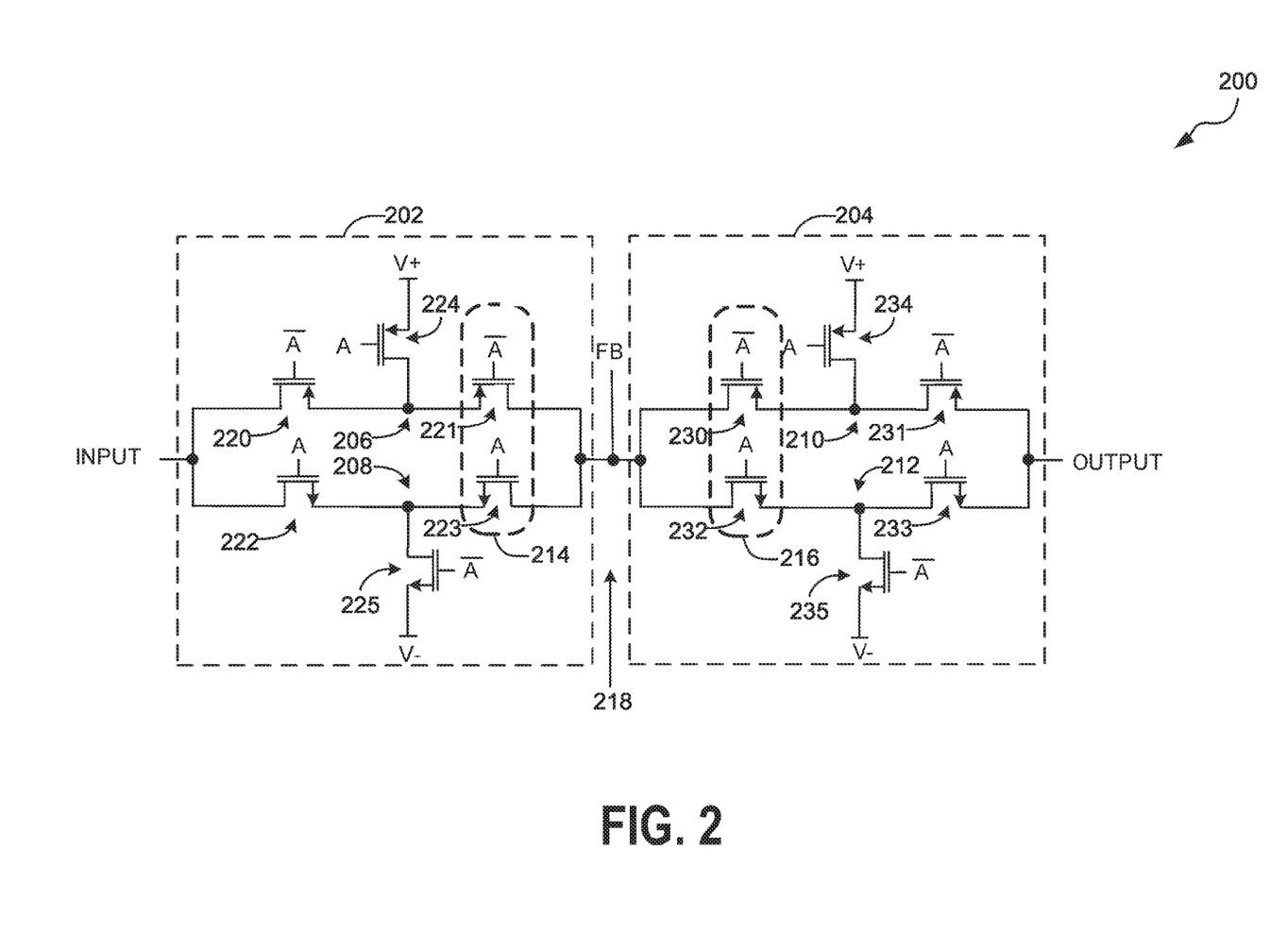
FIG. 2 is a schematic diagram illustrating an example T-junction based switch network, according to an embodiment.

According to certain embodiments, the Kelvin sensing switch network 104 of FIG. 1 can include one or more T-junction switch networks. FIG. 2 is a schematic diagram illustrating an example T-junction switch network to implement a portion of the Kelvin sensing switch network 104 of any one of FIG. 1 or 3-4F. The illustrated switch network 200 may have its input connected to the output of the transimpedance amplifier 102 (e.g., as shown in FIGS. 1 and 3-4F) and its output connected to the input of the output amplifier 118 (FIGS. 1, 3-4F). The illustrated network 200 can correspond to either the path including the input switch 110, the intermediate node 106, and the output switch 112 of FIG. 1, or the path including the input switch 114, the intermediate node 108, and the output switch 116 of FIG. 1. One or more T-junction switch networks can be provided for each of the paths between the output of the transimpedance amplifier 102 (e.g., as shown in FIG. 1 or 3-4F) and the input of the output amplifier 118 (e.g., as shown in FIG. 1 or 3-4F). The illustrated network 200 includes a first switch block 202 and a second switch block 204. The first switch block 202 can implement the input switch 110 or the input switch 114 (with complement control signals) of FIG. 1, and the second switch block 204 can implement the output switch 112 or the output switch 116 (with complement control signals) of FIG. 1. The illustrated network also has a feedback or intermediate node 218, which may correspond to the intermediate node 106 or the intermediate node 108 of FIG. 1.

Each of the switch blocks 202, 204 includes two T-junctions each having a T-junction node, formed with three switches. The first switch block 202 includes three switches 220, 221, 224, connected at a T-junction node 206, forming a first T-junction, and three switches 222, 223, 225, connected at a T-junction node 208, forming a second T-junction. Similarly, the second switch block 204 includes three switches 230, 231, 234, connected to a T-junction node 210, forming a first T-junction, and three switches 232, 233, 235, connected at a T-junction node 212, forming a second T-junction.

The switch blocks 202, 204 can have their off alternating current (AC) leakage reduced significantly by forming a series switch (e.g., 220, 221 in series, 222, 223 in series) where an intermediate T-junction node (e.g., 206, 208) is electrically connected to a reference or rail voltage level V+ or V− through a pull-up device (e.g., switch 224) or a pull-down device (e.g., switch 225). For example, as illustrated in FIG. 2, the T-junction nodes 206, 210 are electrically connected to the reference level V+ through a pull-up device 224, 234, respectively, and the T-junction nodes 208 and 212 are electrically connected to the reference node V− through a pull-down device 225, 235, respectively.

In the implementation illustrated in FIG. 2, the switch blocks 202, 204 are configured to be on in response to a first control signal (e.g., $\overline{A}$), and off in response to a second control signal (e.g., A), and each of the switch blocks 202, 204 implements the function of each of the switches 110, 112, respectively, in FIG. 1. The switch blocks 202, 204 are configured to have the T-junction nodes 206, 208, 210, 212 disconnected from the reference levels V+, V− and connect the input node to the output node through the switches 220-223, 230-233 in response to the first control signal being asserted (e.g., $\overline{A}$ being at a logic 1 value). In response to a second control signal being asserted (e.g., A being at a logic 1 value), the switch blocks 202, 204 are configured to have the T-junction nodes 206, 210 connected to the first rail V+ and the T-junction nodes 208, 212 connected to the second rail V−, and the input node and the output nodes are disconnected as the switches 220-223, 230-233 are off. In this example, the T-junction nodes 206, 210, 208, 212 would be pulled up or down by respective pull-up or pull-down devices, and leakage of the switches 220-223, 230-233 can be bypassed and shorted to one of the reference levels V+ or V− rather than going through the switches as a signal error. Any AC leakage to the reference levels V+ and V− from the transimpedance amplifier 102 (e.g., as illustrated in any of FIGS. 1, 3-4F) can be an error signal that appears as a high impedance. In this example, the two control signals A, $\overline{A}$ are inverse of or complementary to each other.

When implementing a plurality of parallel Kelvin sensing channels of the Kelvin sensing switch network 104 illustrated in FIGS. 1, 3-4F, the plurality of the T-junction switch networks can be implemented with a plural sets of the switch blocks 202, 204, each set responsive to different complementary signals. For example, an embodiment having three Kelvin sensing channels (e.g., 104a in FIGS. 3-4F) can have three sets of the T-junction switch blocks (e.g., 202, 204), and the switches (e.g., 220-225, 230-235) in each set of the switch blocks (e.g., 202, 204) may be responsive to a complementary control signal pair A/$\overline{\text{A}}$, B/$\overline{\text{B}}$, or C/$\overline{\text{C}}$.

In each of the switch blocks 202 and 204, a set of switches 214 or 216 respectively may reduce the leakage, including an off condition direct current (DC) leakage. In some embodiments, each of the sets of switches 214 and 216 may have a layout as two stripe devices with shared sources and/or drains. The shared source and/or drain can be a single stripe connected to the intermediate node 218 with a minimal diffusion area to, for example, substantially minimize DC leakage, which can be proportional to diffusion area. In other embodiments, more than two strips can be used for the layout of each of the sets of switches 214 and 216, with the shared sources and/or drains with the fewest number of diffusions can be connected to the feedback node 218. The switch network 200 and the transimpedance amplifier 102 (FIGS. 1, 3-4F) may be implemented on one die. In some instances, the transimpedance amplifier 102 (FIGS. 1, 3-4F), the switch network 200, and the output amplifier 118 (FIGS. 1, 3-4F) may be implemented on one die.

An advantage of using the illustrated network 200 is improved performance of variable gain transimpedance amplifiers for high impedance current output sensors. Another advantage of the illustrated network 200 is an increased bandwidth of the transimpedance amplifier. In some embodiments, the signal bandwidth may be around 15 MHz if implemented as disclosed herein rather than 10 kHz, which is a typical range. Another advantage includes a wide range of impedance values that can be selected, and the range of selection can be in 4 orders of magnitude depending on the desired frequency range. For example, a 1 kΩ resistance may be selected for one feedback loop for operations at around 10 MHz while a 10 MΩ resistance may be selected for another feedback loop for operations at around 100 kHz.

Figure 3:
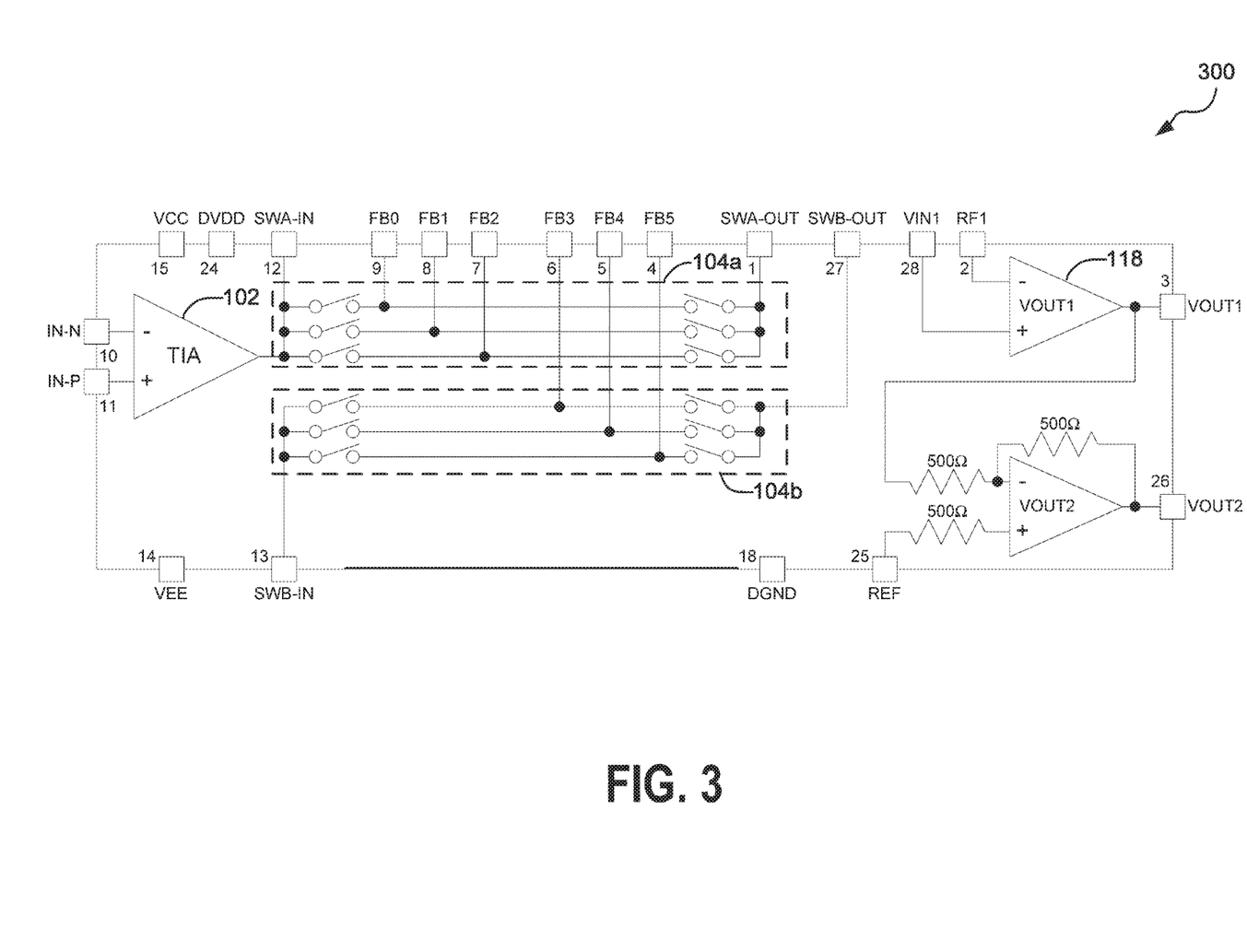
FIG. 3 is a schematic diagram illustrating an example integrated transimpedance amplifier, according to an embodiment.

FIG. 3 is a schematic diagram illustrating an example integrated transimpedance amplifier 300. The integrated transimpedance amplifier 300 can include the transimpedance amplifier 102, one or more Kelvin sensing switch networks 104a, 104b, and the output amplifier 118. The integrated transimpedance amplifier 300 can be implemented on a single die as shown. As illustrated in FIG. 3, the intermediate nodes of the Kelvin sensing switch networks can be electrically connected to their respective contacts, FB0, FB1, FB2, FB3, FB4, FB5, which can be pins of an integrated circuit (IC) chip. The input amplifier 102 can be optimized for relatively low input bias current. The switches coupled to the output of the input amplifier 102 in FIG. 3 can implement any combination of features of the Kelvin sensing networks discussed with reference to FIGS. 1 and/or 2. While these switches are illustrated to show their logical functionality in FIG. 3, it will be understood that each switch can be implemented by multiple circuit elements in certain embodiments. For instance, some or all of the switches shown in FIG. 3 can be implemented by a 6 transistor T-junction switch network of FIG. 2. The two switch sections (from SWA-IN to SWA-OUT and from SWB-IN to SWB-OUT) may be optimized for low leakage current as disclosed herein. The integrated transimpedance amplifier 300 can include a control circuit to provide control signals to selectively turn on and turn off the Kelvin sensing switches. The two-section output amplifier(s) (VOUT1, VOUT2) can be used as a differential amplifier. By disabling VOUT2, the output section amplifier(s) can be used as a single-ended output amplifier. The output amplifier(s) can drive an analog to digital converter (ADC), for example.

In one embodiment, the example integrated transimpedance amplifier may also include a serial/parallel control port (not shown) configured to receive a plurality of control signals such as enable, mode, clock, etc. As shown in FIG. 3, all the elements illustrated in FIG. 3 may be implemented on one die. In another embodiment, a subset of the elements illustrated in FIG. 3 may be implemented on one die and/or additional elements, such as control circuitry, can also be include on the one die. In one example application, the integrated transimpedance amplifier of FIG. 3 may include TIA-ADC driver filter connections (SWA/B-OUT to VIN). Other example applications of FIG. 3 are discussed in connection with FIGS. 4A-4F. In these example applications, electrical connections and/or additional circuit elements external to the integrated transimpedance amplifier 300 can implement various functionalities in combination with the integrated transimpedance amplifier 300.

Figure 4A:
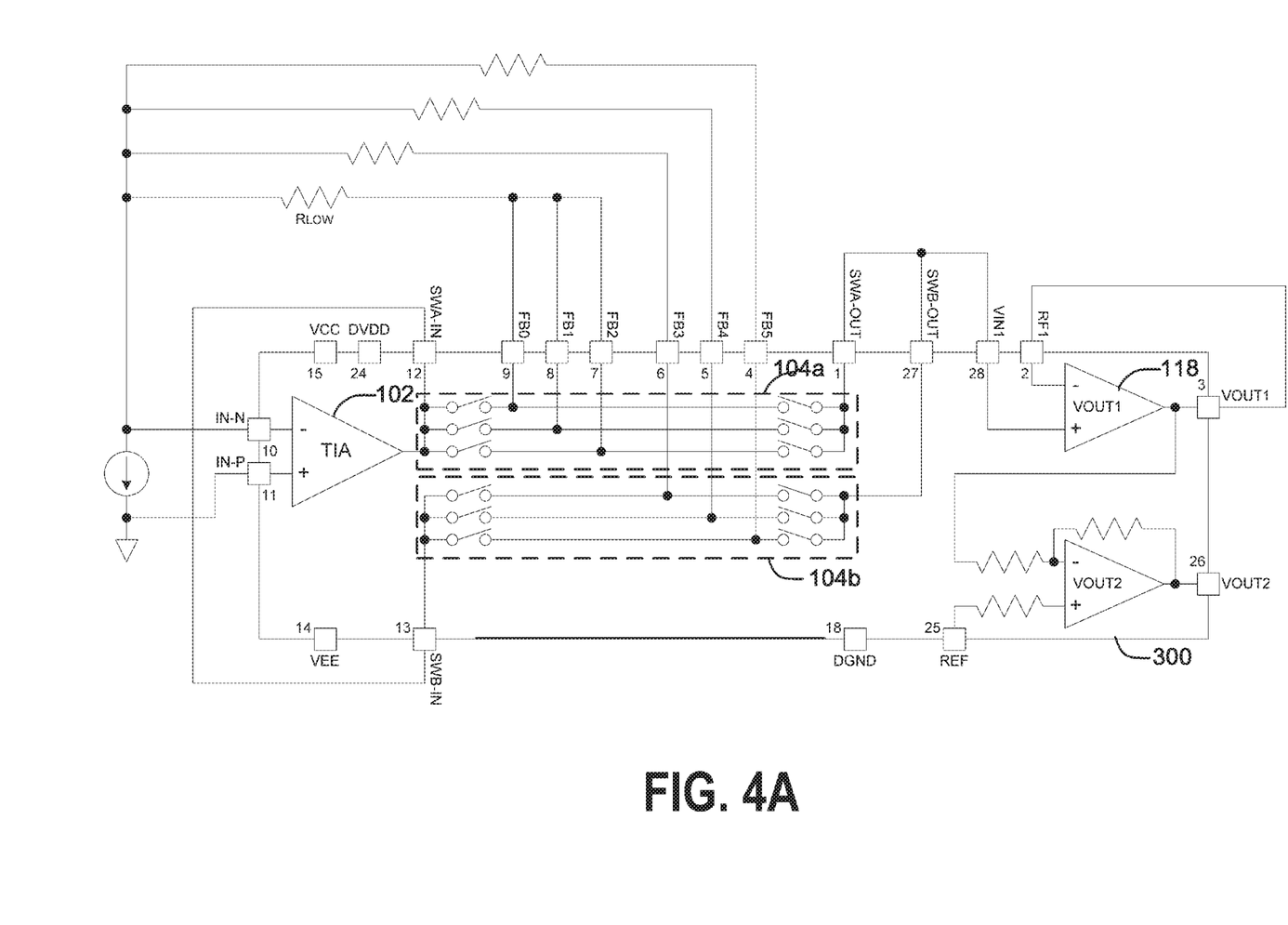
FIG. 4A is a schematic diagram illustrating an example application of the example integrated transimpedance amplifier of FIG. 3.

FIG. 4A is a schematic diagram illustrating an example application of the example integrated transimpedance amplifier 300 of FIG. 3. FIG. 4A shows an example application of the disclosure herein for parallel switches for a relatively low on resistance (Ron). The input switches may have an equivalent on resistance (Ron) of, for example, about 150 Ω. The output switches have Ron of, for example, about 300 Ω. The input Ron may limit the lowest suitable value of feedback resistor $R_{LOW}$ that can be used to achieve a desired performance. By connecting switch sections FB0, FB1, and FB2 in parallel, the effective resistance of the input switches can be reduced. In the illustrated example of FIG. 4A, the effective Ron is divided by 3. Accordingly, when Ron is 150 Ω, the effective Ron of three switches in parallel is 50 Ω.

Figure 4B:
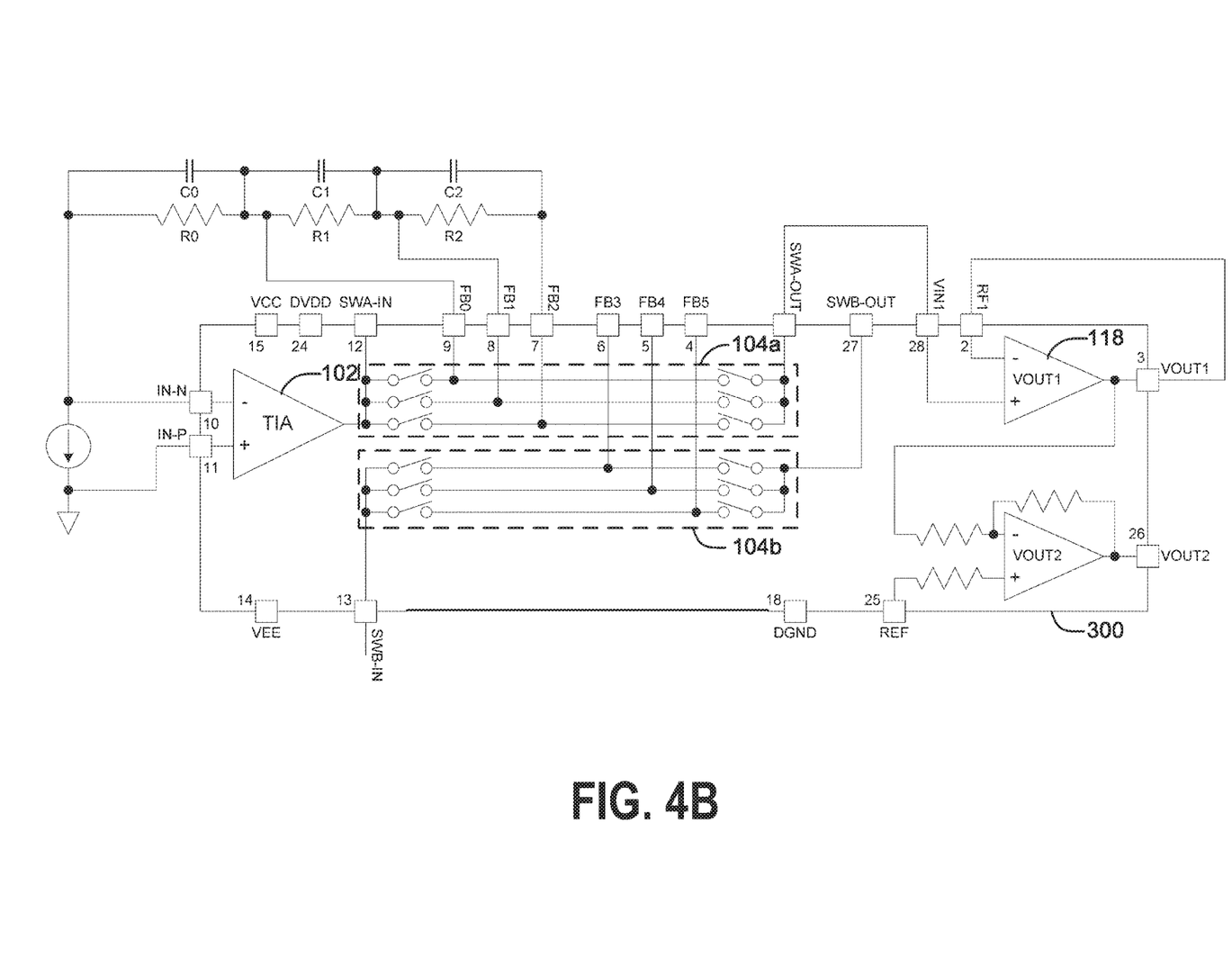
FIG. 4B is a schematic diagram illustrating another example application of the example integrated transimpedance amplifier of FIG. 3.

FIG. 4B is a schematic diagram illustrating another example application of the example integrated transimpedance amplifier of FIG. 3. FIG. 4B shows an example application of the disclosure herein for serial network connections. By connecting the feedback in serial, the gain of the transimpedance amplifier TIA can be selected by adding or removing gain sections to get the desired gain. As illustrated in FIG. 4B, each gain section includes a resistor R0, R1, or R2 in parallel with a capacitor C0, C1, or C2, respectively.

Figure 4C:
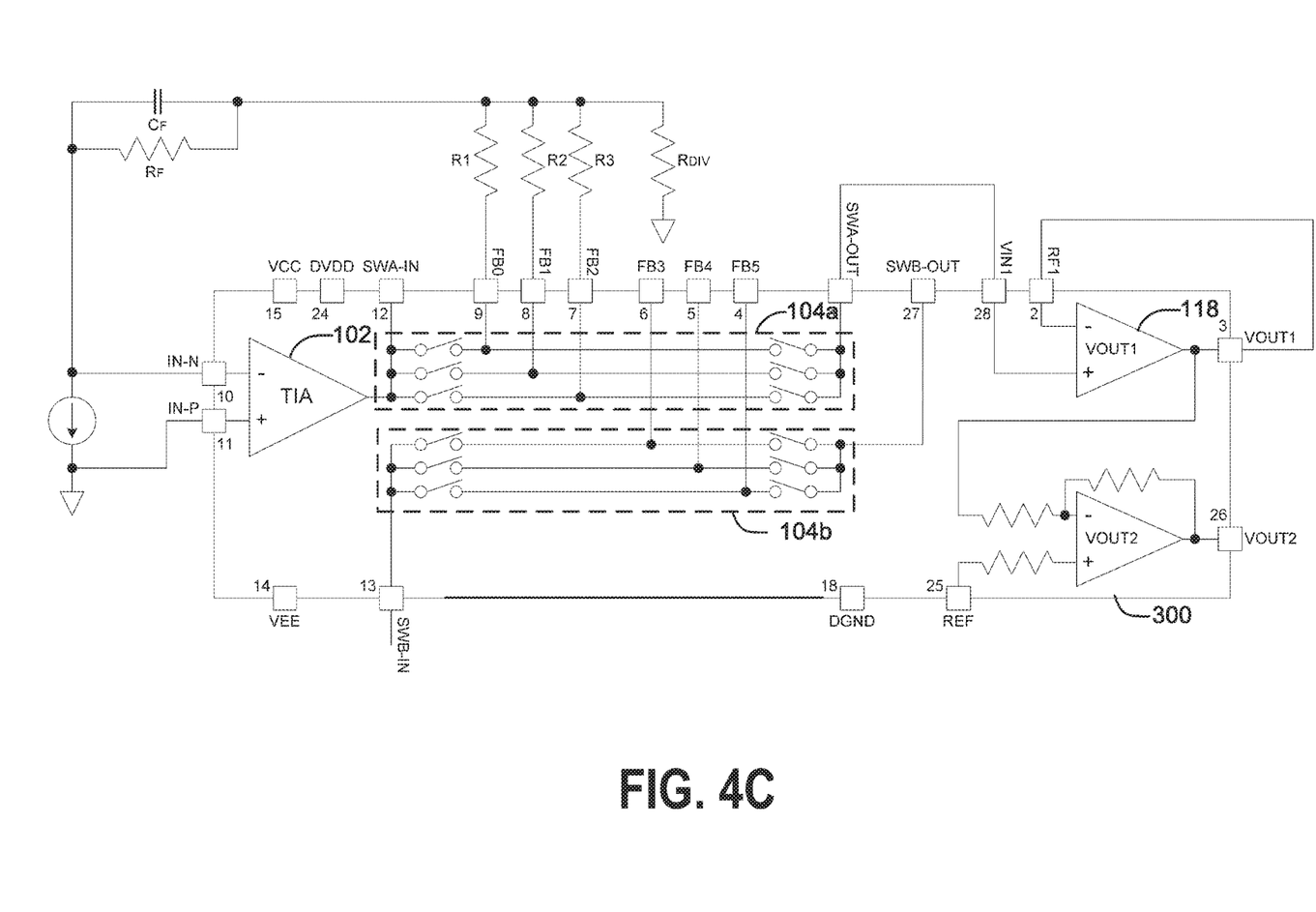
FIG. 4C is a schematic diagram illustrating another example application of the example integrated transimpedance amplifier of FIG. 3.

FIG. 4C is a schematic diagram illustrating another example application of the example integrated transimpedance amplifier of FIG. 3. FIG. 4C shows an example application of the disclosure herein for T-network connections. By connecting resistors electrically connected to different switches as a T-network, the gain can be adjusted with the resistive dividing of $R_F$ to achieve the desired gain. The arrangement shown in FIG. 4C can reduce or eliminate leakage current effects from multiple gain paths on the negative input (IN-N) summing junctions in certain applications. In some embodiments, the resistance $R_F$ value may be a relatively high resistance.

Figure 4D:
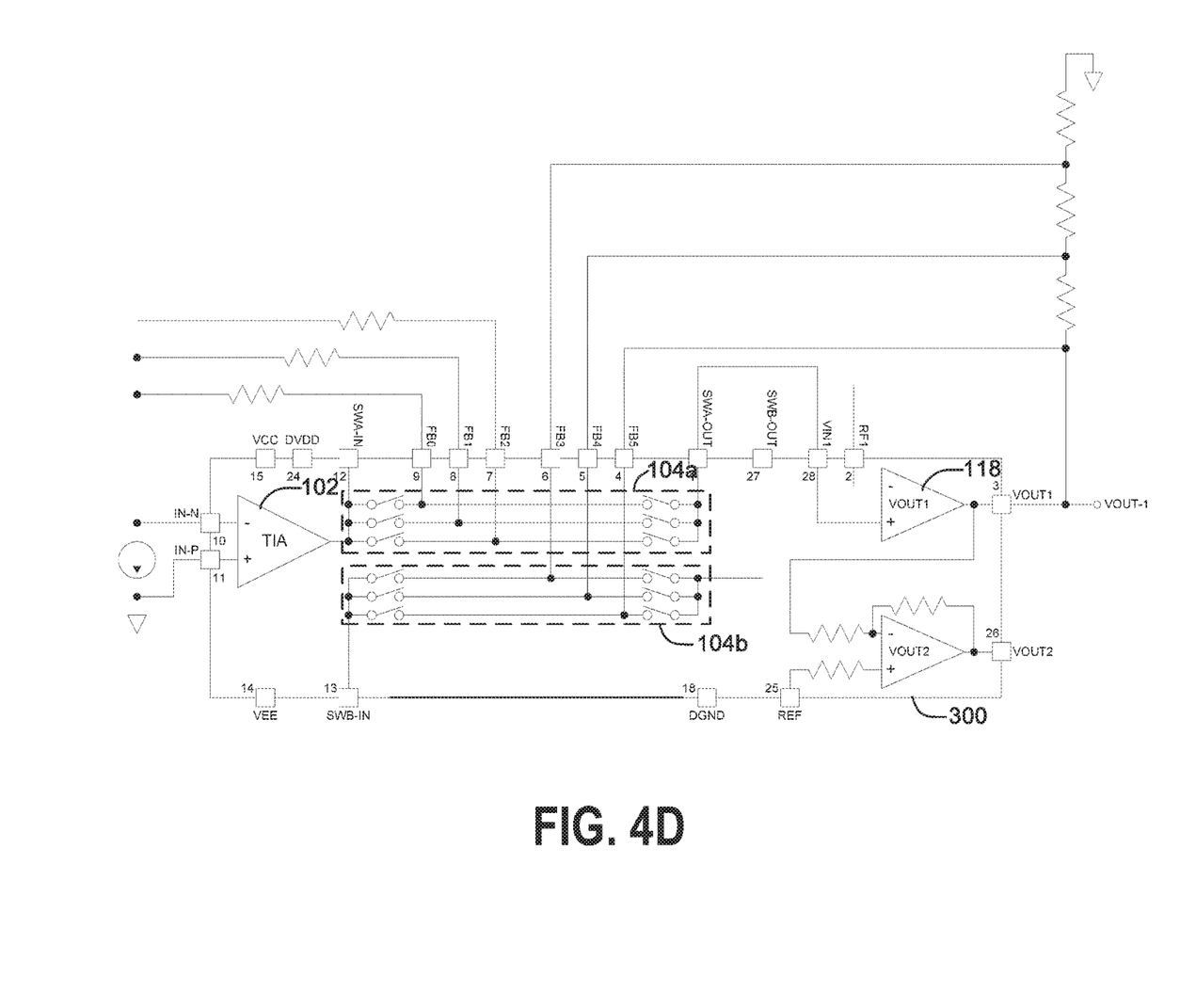
FIG. 4D is a schematic diagram illustrating another example application of the example integrated transimpedance amplifier of FIG. 3.
Figure 4E:
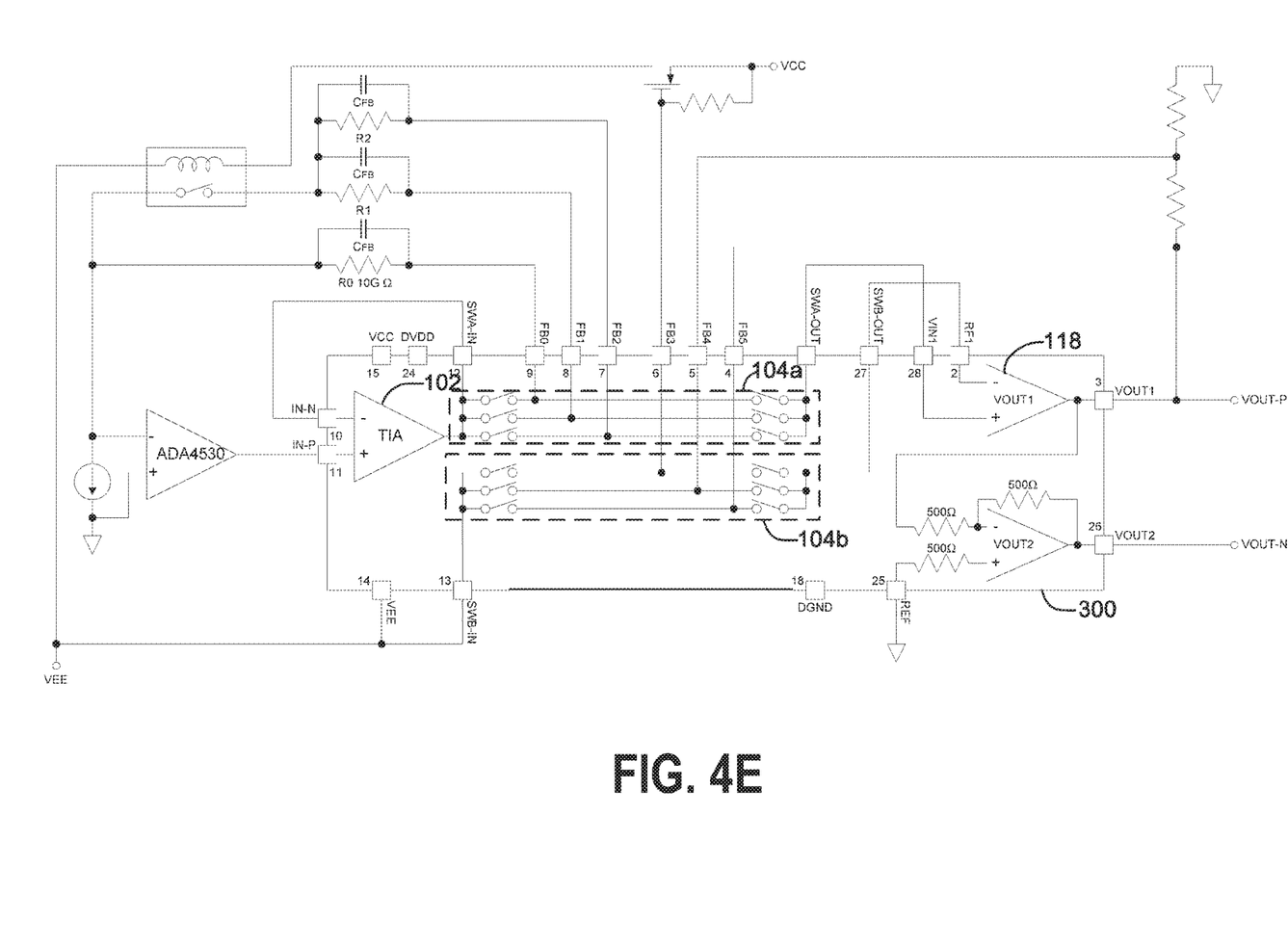
FIG. 4E is a schematic diagram illustrating another example application of the example integrated transimpedance amplifier of FIG. 3.

FIG. 4D is a schematic diagram illustrating another example application of the example integrated transimpedance amplifier of FIG. 3. FIG. 4D shows an example application of the disclosure herein for TIA and ADC driver gain change. As illustrated in FIGS. 4D-E and described herein, it can be advantageous to have the second Kelvin sensing switch network 104b as at least parts of the second Kelvin sensing switch network 104b can be used with the output amplifier 118 to change ADC driver gain of an ADC that receives the output of the output amplifier 118 as an input, for example.

FIG. 4E is a schematic diagram illustrating another example application of the example integrated transimpedance amplifier of FIG. 3. FIG. 4E shows an example application of the disclosure herein for hybrid amplifiers, auxiliary switches, and ADC gain change. In this example application the second Kelvin sensing switch network 104*b* is partly used with the transimpedance amplifier 102 and partly used with the output amplifier 118.

Figure 4F:
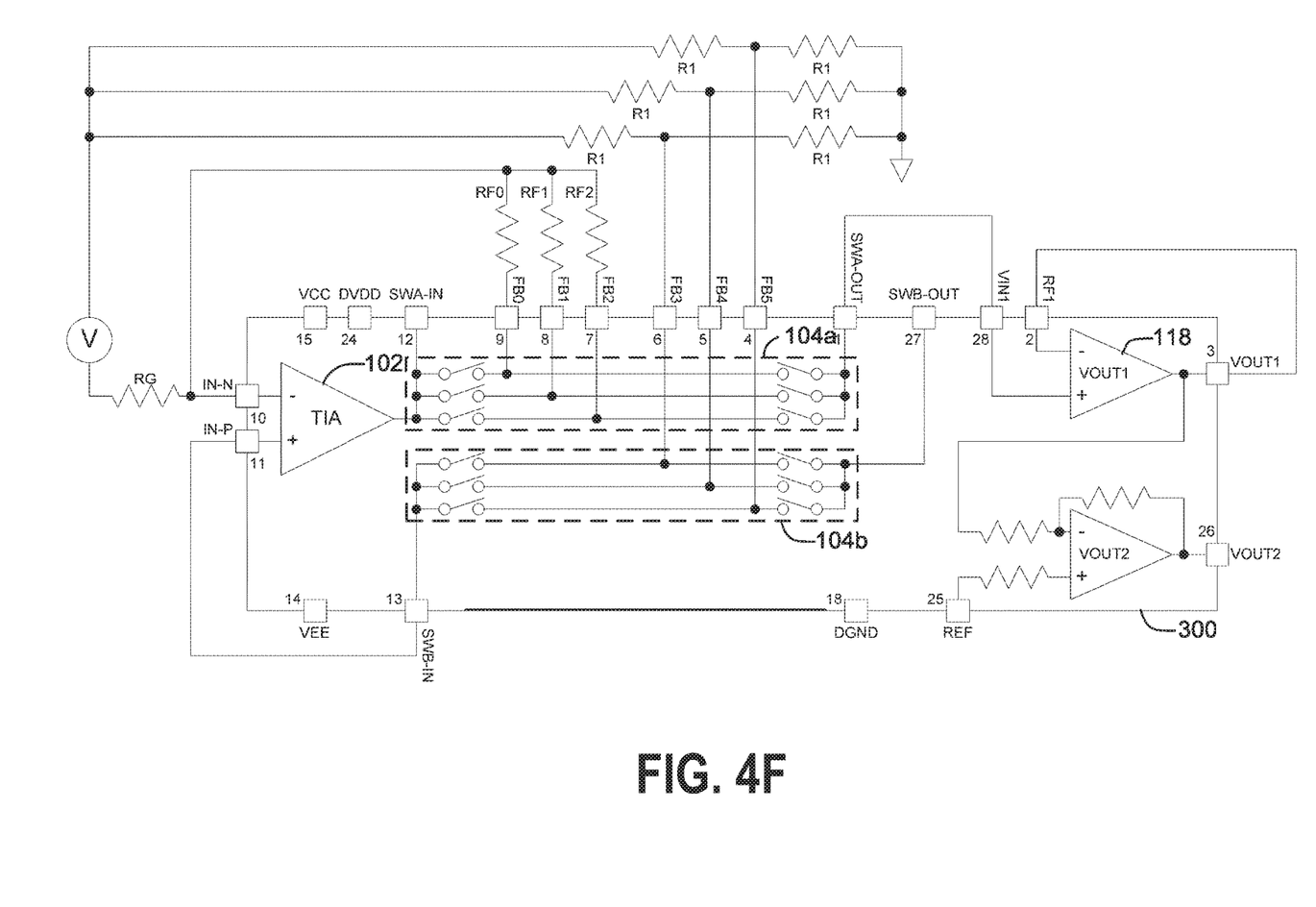
FIG. 4F is a schematic diagram illustrating another example application of the example integrated transimpedance amplifier of FIG. 3.

FIG. 4F is a schematic diagram illustrating another example application of the example integrated transimpedance amplifier. FIG. 4F shows an example application of the disclosure herein for a digitally controlled difference amplifier.

The systems, apparatus, and/or methods discussed herein can be implemented in various electronic devices. Examples of the electronic devices can include, but are not limited to, consumer electronic products, parts of the consumer electronic products, electronic test equipment, wireless communications infrastructure such as base stations, automotive electronics, other vehicular electronics, industrial electronics, etc. Examples of the electronic devices can also include memory chips, memory modules, circuits of optical networks or other communication networks, and disk driver circuits. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a wrist watch, a clock, etc. Further, the electronic device can include unfinished products.

Unless the context clearly requires otherwise, throughout the description and the clauses, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings provided herein can be applied to other apparatus, not necessarily the apparatus described above. The elements and acts of the various embodiments described above can be combined to provide further embodiments.

While certain embodiments have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods and systems described herein may be made without departing from the spirit of the disclosure.

What is claimed is:

1. An apparatus comprising a die, the die comprising:
   a transimpedance amplifier;
   a switch network comprising an input switch, an intermediate node, and an output switch, the input switch being electrically connected to the output switch at the intermediate node, wherein the input switch comprises a first T-junction switch network that includes at least three switches, wherein the output switch comprises a second T-junction switch network that includes at least three switches, wherein the input switch is electrically connected between an output of the transimpedance amplifier and the intermediate node; and
   a contact configured to provide an electrical connection to the intermediate node external to the die.

2. The apparatus of claim 1, wherein the contact is a pin.

3. The apparatus of claim 1, wherein the die further comprises another contact electrically connected to an input of the transimpedance amplifier.

4. The apparatus of claim 1, wherein first T-junction switch network comprises:
   a first switch;
   a second switch;
   a pull-up device connected to a first junction between the first switch and the second switch;
   a third switch;
   a fourth switch; and
   a pull-down device connected to a second junction between the third switch and the fourth switch,
   wherein the pull-up device and the pull-down device are configured to be on responsive to a first signal, wherein the first, second, third, and fourth switches are configured to be on responsive to a second signal, and wherein the first signal is an inverse of the second signal.

5. The apparatus of claim 4, wherein the first switch is electrically connected between the output of the transimpedance amplifier and the first junction, and wherein the second switch is electrically connected between the first junction and the intermediate node.

6. The apparatus of claim 5, wherein the second switch and the fourth switch have physical layouts that cause direct current (DC) leakage to be reduced.

7. The apparatus of claim 1, wherein the die further comprises at least one output amplifier.

8. The apparatus of claim 1, wherein:
   the die further comprises a second switch network and a second contact;
   the second switch network comprises a second input switch, a second intermediate node electrically connected to the second contact, and a second output switch; and
   the second input switch is electrically connected to the second output switch at the second intermediate node.

9. The apparatus of claim 1, the die further comprising:
   a plurality of additional contacts,
   wherein the switch network comprises a plurality of additional input switches and a plurality of additional intermediate nodes,
   wherein each of the plurality of additional input switches is electrically connected between the output of the transimpedance amplifier and a respective additional intermediate node of the plurality of additional intermediate nodes, wherein each of the plurality of additional intermediate nodes is electrically connected to a respective additional contact of the plurality of additional contacts.

10. The apparatus of claim 9, wherein the switch network is configured to switch on or off a plurality of feedback loops to an inverting input of the transimpedance amplifier.

11. The apparatus of claim 9, further comprising:
a plurality of resistors external to the die,
wherein each of the plurality of resistors is electrically connected between an input of the transimpedance amplifier and a respective contact of the plurality of additional contacts.

12. The apparatus of claim 10, wherein bandwidth of the apparatus is on the order of 10 MHz.

13. An apparatus comprising:
a transimpedance amplifier; and
Kelvin sensing switches electrically connected to an output of the transimpedance amplifier, the Kelvin sensing switches comprising:
a first T-junction switch network comprising at least three switches; and
a second T-junction switch network comprising at least three other switches,
wherein the first T-junction switch network is coupled to the second T-junction switch network by way of an intermediate node, and the first T-junction switch network is coupled between an output of the transimpedance amplifier and the intermediate node.

14. The apparatus of claim 13 further comprising a resistor electrically coupled between the intermediate node and an input of the transimpedance amplifier.

15. The apparatus of claim 13, wherein the first T-junction switch network comprises:
a first switch;
a second switch;
a third switch, the first, second, and third switches being electrically connected to form a first T-junction;
a fourth switch;
a fifth switch; and
a sixth switch, the fourth, fifth, and sixth switches being electrically connected to form a second T-junction,
wherein the third switch is electrically connected between a first rail and the first T-junction, and the sixth switch is electrically connected between a second rail and the second T-junction,
wherein the first T-junction is configured to be at the first rail voltage based at least partly on a state of a first signal and the second T-junction is configured to be at the second rail voltage based at least partly on the state of the first signal.

16. The apparatus of claim 15, wherein the second switch and the fifth switch are electrically connected to the transimpedance amplifier, and wherein the third switch and the sixth switch are configured to cause direct current (DC) leakage to be reduced.

17. A method of amplifying an input signal, the method comprising:
amplifying an input signal received at an input of a transimpedance amplifier to provide an amplified signal at an output of a pair of Kelvin sensing switches,
wherein the pair of Kelvin sensing switches comprises an input switch and an output switch arranged in series with the input switch, the input switch coupled between an output of the transimpedance amplifier and an intermediate node, wherein the input switch comprises a first T-junction switch network that includes at least three switches, wherein the output switch comprises a second T-junction switch network that includes at least three switches.

18. The method of claim 17, wherein a resistor is electrically connected between the intermediate node and the input of the transimpedance amplifier, and wherein the resistor is external to a die that includes the pair of Kelvin sensing switches.

19. The method of claim 17, further comprising turning on a different pair of Kelvin sensing switches coupled to the output of the transimpedance amplifier.

20. The apparatus of claim 1, further comprising an impedance element external to the die and coupled to the contact of the die, the impedance element being coupled between the intermediate node and an input to the transimpedance amplifier.

21. The apparatus of claim 1, wherein the switch network is configured so as to change a gain of the transimpedance amplifier.

* * * * *